(12) United States Patent
Ruelke et al.

(10) Patent No.: US 10,491,235 B1
(45) Date of Patent: Nov. 26, 2019

(54) DEVICES AND METHODS FOR MULTI-MODE SAMPLE GENERATION

(71) Applicant: Motorola Solutions, Inc., Chicago, IL (US)

(72) Inventors: Charles R. Ruelke, Coral Springs, FL (US); Clarence Coffee, Pembroke Pines, FL (US)

(73) Assignee: Motorola Solutions, Inc., Chicago, IL (US)

( * ) Notice: Subject to any disclaimer, the term of this patent is extended or adjusted under 35 U.S.C. 154(b) by 0 days.

(21) Appl. No.: 16/230,771

(22) Filed: Dec. 21, 2018

(51) Int. Cl.
| | |
|---|---|
| *H03M 3/00* | (2006.01) |
| *H04B 1/00* | (2006.01) |
| *H04B 1/525* | (2015.01) |
| *H04L 1/00* | (2006.01) |
| *H03M 1/06* | (2006.01) |
| *H04L 25/03* | (2006.01) |

(52) U.S. Cl.
CPC ......... *H03M 3/344* (2013.01); *H03M 1/0609* (2013.01); *H03M 3/368* (2013.01); *H04B 1/0039* (2013.01); *H04B 1/525* (2013.01); *H04L 1/0025* (2013.01); *H04L 25/03019* (2013.01)

(58) Field of Classification Search
CPC ................ H03M 3/344; H03M 1/0609; H04L 25/03019; H04L 1/0025; H04B 1/525; H04B 1/0039

USPC ........................................................ 341/155
See application file for complete search history.

(56) References Cited

U.S. PATENT DOCUMENTS

| | | | |
|---|---|---|---|
| 7,362,188 B2 | 4/2008 | Leclercq | |
| 8,164,357 B2 | 4/2012 | Cauli et al. | |
| 8,576,951 B2 | 11/2013 | Mombers et al. | |
| 8,666,353 B2* | 3/2014 | Walley | H04B 1/0003 375/324 |
| 8,867,650 B2 | 10/2014 | Huang et al. | |
| 8,947,283 B2* | 2/2015 | Zhu | H03M 1/1215 341/122 |
| 9,154,146 B1* | 10/2015 | Chiu | H03M 1/069 |

\* cited by examiner

*Primary Examiner* — Brian K Young
(74) *Attorney, Agent, or Firm* — Baker Botts L.L.P.

(57) ABSTRACT

Disclosed herein are multi-mode methods and devices for sample generation. An exemplary device for generating an output sample includes an analog-to-digital converter (ADC) for sampling a plurality of input analog signals and producing an ADC output sample. The ADC may include a ADC digital modulator including timing-critical components. A plurality of digital blocks may be coupled to the ADC digital modulator. The exemplary device may include a baseband processor for controlling a plurality of clock inputs. The plurality of clock inputs may drive the ADC digital modulator and the plurality of digital blocks. The baseband processor may be configured to operate in a plurality of modes including a first mode and a second mode. The first mode may include a first mode standby state and a first mode initial operating state. The second mode may include a second mode initial operating state and a second mode standby state.

18 Claims, 2 Drawing Sheets

DEVICES AND METHODS FOR MULTI-MODE SAMPLE GENERATION

BACKGROUND OF THE INVENTION

It can be useful to receive and process transmitted signals of different telecommunications protocols. For example, a first responder may wish to use a device to receive an incoming call on a secure or emergency communications channel. Such a call may be sent according to a certain protocol, such that the electronic data contained in the call must be properly deciphered by the receiving device in accordance with the protocol. The first responder may also wish to use that same device to receive personal calls, where the personal calls are sent as electronic data according to another protocol. The first responder may also not want to carry around additional devices, each for receiving data according to separate protocols. Accordingly, the first responder may desire a device or method that can receive data sent according to different telecommunication protocols.

SUMMARY

Disclosed herein are devices for generating an output sample upon receiving input signals of different protocols. The devices can operate in different modes to process signals of different protocols while maintaining energy efficiency. The devices also can switch modes in real time to process signals of different protocols without losing or corrupting data.

Some exemplary devices include an analog-to-digital converter (ADC) for sampling a plurality of input analog signals and producing an ADC output sample. The ADC may include an analog portion of the analog-to-digital converter subsystem (ADC front end) for pre-conditioning of the analog input signal The analog portion of the ADC includes, buffering and noise compensation, and other non-timing-critical components. The ADC may also include a digital portion of the analog-to-digital converter subsystem (ADC digital modulator) which encompasses all timing-critical components.

For filtering and other signal processing, some exemplary devices include a plurality of digital blocks coupled to the ADC digital modulator. In some protocols, a sample-specific timestamp is needed to determine when a given sample is generated relative to others samples that may have already been processed as part of a protocol event (i.e.: synchronization, channel change, and/or other operating state changes). Accordingly, the plurality of digital blocks may include a counter for assigning a timestamp to the ADC output sample, or samples generated by subsequent post-ADC digital stages.

Some exemplary devices include a baseband processor for controlling a plurality of clock inputs according to a plurality of protocols. The plurality of clock inputs may drive the ADC digital modulator and the plurality of digital blocks following the ADC subsystem. The baseband processor may be configured to operate in a plurality of modes. The plurality of modes may include a first mode and a second mode. The first mode may include a first mode standby state and a first mode initial operating state. The second mode may include a second mode initial operating state.

To transition the device from a standby state to an initial operating state, the baseband processor may be operable to receive a trigger signal when operating in the first standby state. Upon receiving the trigger signal, the baseband processor may be operable to transition from the first standby state to a first initial operating state of the first mode to process signals of some protocols. The baseband processor may be operable to receive a second trigger signal when operating in the second standby state. The baseband processor may be able to transition from the second standby state to a second initial operating state of the second mode upon receiving the second trigger signal to process signals of other protocols.

In some exemplary devices, while operating in the first standby state, the baseband processor may be configured to enable the ADC clock input of the plurality of clock inputs to continuously drive the ADC digital modulator. The baseband processor may be configured to enable a second clock input of the plurality of clock inputs to drive at least a first digital block of the plurality of digital blocks. The plurality of digital blocks may follow the ADC subsystem. The timing of the activation of the second clock may be agonistic the particular RF protocol. However, the activation time of the second clock signal may be governed by internal radio maintenance routines. The device can thereby process signals of some protocols that do not require synchronization to RF protocol timing, with some components (such as the first digital block) having processing times being stochastic relative to other components' processing times (such as the ADC digital modulator).

In some exemplary devices, when operating in the first standby state, the baseband processor is configured to reset the ADC digital modulator and the plurality of digital blocks and disable the plurality of clock inputs. The device can thereby process signals for protocols that require a deterministic time of arrival (TOA) of the first sample after activation of processing of received signals, with digital subsystem components processing at known times relative to the external protocol timing constraints such as Time Division Multiple Access (TDMA) Slot times.

Sometimes the device may need to transition from a standby state for processing signals according to some protocols to an initial operating state that can handle signals of other protocols. In some standby states, components may need to be held in an initial state of continuous reset. In some standby states components may be continuously running, with digital processing ongoing. In some initial operating states, specific digital components within a digital subsystem may be configured to continuously process samples to maintain timing synchronization to previous samples, while other digital components within the same digital subsystem are held in constant reset. In these configurations, the sample fidelity itself is not necessarily critical, given the continuously active digital blocks may be processing samples from previous components that are in reset, thus the sample values being processed are meaningless; however, the timing of the samples, in absolute time relative to an occurrence of past symbol decoding within a given protocol, can be critical to maintaining a state of synchronized processing within the protocol frame structure. Switching the digital subsystem from a state of continuous reset (e.g., where some or all digital blocks are held in continuous reset), to a state of continuous processing of samples (e.g., where all of the digital blocks comprising a digital subsystem are processing samples continuously) may introduce transient responses upon start-up of sample processing that could introduce elongated recovery times that would corrupt valid data, or otherwise negatively affect the resulting output sample. Additionally, switching the device from a standby state of continuous operation to an initial operating state of initial processing, such that some components initiate processing of received signals at the same time relative to other components, could introduce transient responses upon start-up that could corrupt data or otherwise negatively affect the resulting output sample. Accordingly, some exemplary devices may operate in a third initial operating state of a third mode wherein the baseband processor can selectively control components to transition between processing signals of different protocols.

Some exemplary baseband processors are configured to, when operating in the first standby state, continuously generate a plurality of ADC output samples with the output sample rate functioning as an indicator signal for generating a timestamp in a time domain of the ADC digital modulator and continuously run a second clock input of the plurality of clock inputs to drive at least a first digital block of the plurality of digital blocks.

In some exemplary first standby state, the baseband processor is configured to hold in constant reset the ADC digital modulator and the plurality of digital blocks.

In some exemplary dynamic initial operating states, when operating in the dynamic initial operating state, is operable to selectively applying the plurality of clock inputs and selectively activating the plurality of digital blocks.

In some exemplary initial operating states, the baseband processor is configured to blank at least a first digital block output sample of a first digital block of the plurality of digital blocks, while simultaneously permitting at least a second digital block of the plurality of digital blocks to generate a second digital block output sample for a portion of time so as to create a plurality of transient responses. The baseband processor may also operate in the third initial operating state for a predefined period of time, and, after the predefined period of time, transition to an active state.

In some exemplary dynamic initial operating states, the baseband processor is further configured to simultaneously release at least a first digital block of the plurality of digital blocks and a second digital block of the plurality of digital blocks from continuous reset.

In some exemplary receiver digital systems, the plurality of digital blocks are coupled in a cascading configuration, wherein at least a first digital block of the plurality of digital blocks is driven by a first clock input of the plurality of clock inputs, the first clock input having a frequency that is an integer factor of an ADC output sample frequency.

In some exemplary receiver digital systems, the plurality of digital blocks comprise a cascaded integrator-comb filter coupled to an infinite impulse response filter, the infinite impulse response filter coupled to a finite impulse response filter.

Some exemplary receiver digital systems include a switch operable to select at least a first indicator signal of a plurality of indicator signals to pass to the counter, thereby determining a rate at which the value of the timestamp is generated. The plurality of indicator signals may include a first indicator signal generated by the ADC digital modulator and a second indicator signal generated by a first digital block of the plurality of digital blocks. The first indicator signal may be synchronized in time with the ADC output sample The second indicator signal may be synchronized in time with a processed sample generated by the first digital block.

Disclosed herein are signal processing methods. Some exemplary methods include sampling a plurality of input analog signals with an analog-to-digital converter (ADC) to produce an ADC output sample, wherein a plurality of digital blocks is coupled to a digital analog-to-digital subsystem (ADC digital modulator), the ADC digital modulator comprising timing-critical components. Some exemplary methods include controlling a plurality of clock inputs, the ADC digital modulator, and the plurality of digital blocks according to a plurality of protocols, thereby generating an output sample. In some exemplary methods, the controlling the plurality of clock inputs, the ADC digital modulator, and the plurality of digital blocks includes operating in a plurality of states, the plurality of states comprising a first mode standby state, a second mode standby state, a first mode initial operating state, a second mode initial operating state, and a dynamic initial operating state. In some exemplary methods, operating in the plurality of states includes transitioning from operating in the first mode standby state to operating in the first mode initial operating state, transitioning from operating in the second mode standby state to operating in the second mode initial operating state, transitioning from operating in the first mode standby state to operating in the dynamic initial operating state, and transitioning from operating in the second mode standby state to operating in the dynamic initial operating state.

In some exemplary methods, operating in the first standby state includes continuously generating a plurality of ADC output samples with the output sample rate functioning as an indicator signal for generating a timestamp in a time domain of the ADC digital modulator. In some exemplary methods, operating in the first standby state includes continuously running a second clock input of the plurality of clock inputs to drive at least a first digital block of the plurality of digital blocks.

In some exemplary methods, operating in the first standby state includes holding in constant reset the ADC digital modulator and the plurality of digital blocks. In some exemplary methods, operating in the dynamic initial operating state comprises selectively applying the plurality of clock inputs and selectively activating the plurality of digital blocks.

In some exemplary methods, operating in the dynamic initial operating state includes blanking at least a first digital block output sample of a first digital block of the plurality of digital blocks, while simultaneously permitting at least a second digital block of the plurality of digital blocks to generate a second digital block output sample for a portion of time so as to create a plurality of transient responses. In some exemplary methods, the method includes operating in the dynamic initial operating state for a predefined period of time and, after the predefined period of time, transitioning to an active state.

In some exemplary methods, operating in the dynamic initial operating state includes simultaneously releasing at least a first digital block of the plurality of digital blocks and a second digital block of the plurality of digital blocks from continuous reset.

In some exemplary methods, the method includes selecting at least a first indicator signal of a plurality of indicator signals to pass to the counter, thereby determining a rate at which the value of the timestamp is generated. The plurality of indicator signals may include a first indicator signal generated by the ADC digital modulator and a second indicator signal generated by a first digital block of the plurality of digital blocks. The first indicator signal may be synchronized in time with the ADC output sample. The second indicator signal may be synchronized in time with a processed sample generated by the first digital block.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
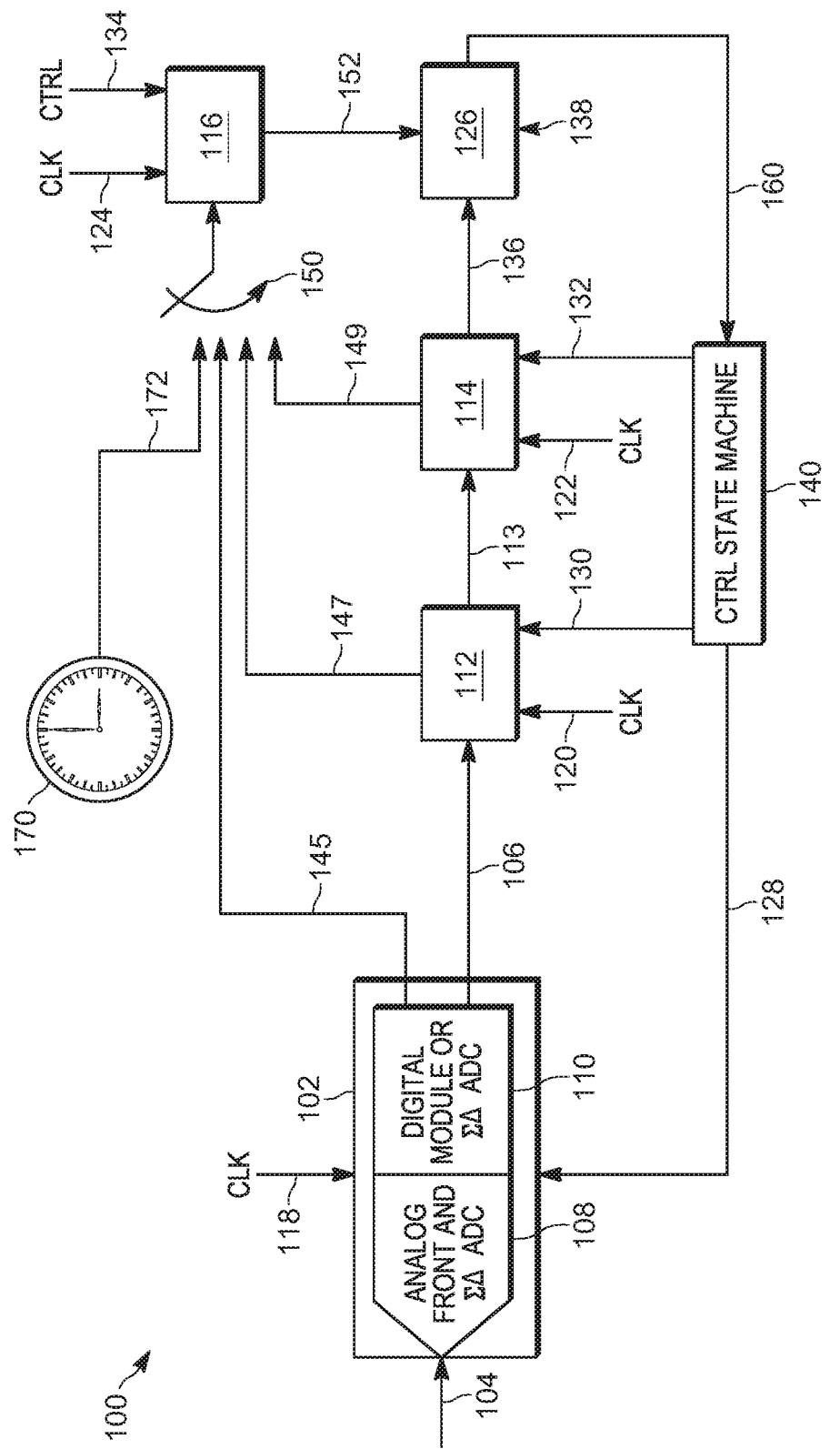
FIG. 1 is a schematic diagram of a device for generating an output sample in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

Transmitted signals that are processed by a receiver to produce sampled receive data may need to go through several processing steps to obtain the data contained therein. For example, devices may use a plurality of digital processing blocks to process received signals, including performing steps such as converting the analog input signal to a digital received sample signal, and filtering to remove undesired interference signals within the sampled receive data. The post-processed sampled received data may subsequently be stored in memory, further processed by a processor, or sent to an electronic speaker, and so forth. As described above, it may be useful to have a device that can adaptively process signals based on different governing protocols. Multiple protocols exist for communicating information. Accordingly, various protocols may offer different advantages when compared to other communication strategies, such as security, battery life or spectral efficiency. As describe herein, "input," "signal," "sample," and "output" may be used interchangeably and refer to one or more signals, unless clearly indicated otherwise.

In some protocols, a component within a digital receiver system, such as an analog-to-digital converter (ADC), may be configured to continuously process samples agnostic to whether a signal is received that is on-channel or otherwise desired. In other protocols, for example, components within the digital receiver system are disabled when not receiving a desired signal. When resuming processing, the digital components may resume operations in a synchronized manner, where processing of the received signals is done at deterministic times, and known initial starting states, relative to other components. Operating a digital component continuously when not processing valid received signal can use more energy and drain the battery of a device, but it may afford the advantage of maintaining synchronicity to a known time frame previously established when actively processing valid received signals when operating within an active protocol. The devices and methods disclosed herein allow for multi-protocol signal processing while also optimizing energy efficiency, component sequencing, and system training, by selectively enabling or disabling targeted digital blocks as needed. The devices and methods disclosed herein provide further advantages in that they facilitate transitioning between different communication protocols in real time, while minimizing the processing delay that may be introduced during the transition. In some embodiments, energy efficient, multi-protocol signal processing is achieved in part by controlling a plurality of digital clocks.

FIG. 1 shows an exemplary receiver digital system 100 for multi-mode sample generation in accordance with some embodiments. The receiver digital system 100 includes an analog-to-digital converter (ADC) 102 for converting an analog input 104 to an ADC output sample 106. The analog input 104 may include a plurality of incoming analog signals. The ADC output sample 106 may include a plurality of signals. The ADC 102 can be any type of suitable ADC converter, including, for example, a sigma delta ADC, or a pipeline ADC having multi-bit precision. Following the conversion of the analog input 104 into an ADC output sample 106, subsequent digital processing may be done as described herein. The ADC 102 is a mixed mode component that includes both analog and digital functions. Therefore, the ADC 102 includes an ADC front end 108 for preconditioning of the analog input 104, and the ADC digital modulator 110 that samples the preconditioned analog signal, thereby generating the ADC output sample 106.

As part of the processing of the analog input 104, the analog ADC front end 108 uses non-timing-critical components that perform processing functions without affecting the sample rate of the ADC—that is, without affecting the rate at which the ADC converts the analog input 104 into digital signals including the ADC output sample 106. Examples of non-timing-critical components include input buffers, band gap reference supplies, capacitor feedback systems for noise cancellation, comparators, and so on.

As part of the processing the received analog input 104, the preconditioned analog signal from the ADC front end 108 is subsequently processed by the ADC digital modulator 110 which may include timing-critical components. The ADC digital modulator 110 may generate the ADC output sample 106 at the output of the ADC 102. Timing critical components are those that are clocked for generating ADC output samples. Examples of timing critical components that may be included in the ADC digital modulator 110 include switch capacitance arrays, quantization levelers, clock alignment circuits, registers, memory, and so on.

The device also includes a digital block 112 and a digital block 114. The digital block 112 and the digital block 114 can each be one or more of numerous types of digital blocks that provide various types of digital functions and may operate using different digital clocks sources, including one or more of the following: a cascaded integrator-comb (CIC) filter, an infinite impulse response (IIR) filter, a finite impulse response (FIR) filter, a decimation or interpolation filter wherein the sample rates are scaled according to processing requirements, and so on. The digital block 112 processes the ADC output sample 106 generated by the ADC digital modulator 110. The digital block 112 processes the ADC output sample 106 and produces a processed sample 113 that is subsequently processed by a digital block 114. The processed sample 113, and any signal, input, or sample, described herein may include or refer to a plurality of signals. Digital block 114 processes the processed sample 113 to produce a processed sample 136 that is communicated to a baseband processor 126. The baseband processor 126 can alternatively or additionally comprise an FPGA, a microprocessor, or other suitable components. The baseband processor 126 can be any suitable digital block that can receive a processed signal. The respective output sample rates for the ADC output sample 106, the processed sample 113, and the processed sample 136 do not have to be equal and may be deterministically proportional to each other based on the processing requirements and functions for each of the respective digital blocks 110, 112, and 114. The timing relationship between the ADC output sample 106, the processed sample 113, and the processed sample 136 may be dependent on the particular analog signal being processed, including bandwidth (BW) of the respective received signal, received power (into the ADC front end 108) and the desired post processed signal fidelity into the baseband processor 126. The deterministic timing relationship between the ADC output sample 106, the processed sample 113, and the processed sample 136 may accordingly be bounded by the particular transmission protocol that governs communicated signal being received and processed by the receiver digital system 100.

Some transmission protocols, such as time-division multiple Access (TDMA) protocols, partition the information to be transmitted to a receiving device into packets, each packet being subsequently assigned to a particular "slot" of time, where the duration and periodicity of the slot-time structure is defined by the TDMA protocol. Each packet of information is communicated to the receiving device during an assigned time slot by transmission "bursts" from a communication source. The time slots assigned to a particular communication source (being received by an assigned receiving device) may be interleaved with time slots that are assigned to different commutation sources (that are assigned to different receiving devices) where the plurality of time slots may be combined to form a TDMA frame that is cyclically repeated. In this way multiple communication devices may operate in tandem, whereby information from different sources may be transmitted to various receiving devices using synchronized slot times within a TDMA structure governed by the TDMA protocol. Once the packets of information have been received by a receiving device, the information is recombined. For example, the analog input 104 may have originated from a TDMA signal and may include corresponding packets. The receiver digital system 100 may recombine each packet contained within the analog input 104 to recreate the original information at the baseband processor 126. Accordingly, a counter 116 may be used to generate a timestamp for a given output sample that is generated by a digital component within the receiver digital system 100. The counter 116, may receive as input an indicator signal 145, an indicator signal 147, and an indicator signal 149 from the ADC 102, the digital block 112, and the digital block 114 through a selection switch 150. The indicator signals 145, 147, and 149 are synchronized in time with the ADC output sample 106, the processed sample 113 and the processed sample 136, respectively. A timestamp is a unique numeric value that is assigned to a specific output sample based on an indicator signal's time of arrival (TOA) at the counter 116 through the selection switch 150. The sample timestamp value is communicated to the baseband processor 126 using a timestamp signal 152. Because the timestamp signal 152 is generated using the indicator signals 145, 147, and 149, which themselves are synchronous to the ADC output sample 106, the processed sample 113, and the processed sample 136, the timestamp signal 152 (and associated timestamp value) may be said to be sample-specific, based on the processing samples generated by digital blocks 110, 112 and/or 114. As the counter 116 is itself a digital block, the ADC digital modulator 110, the digital block 112, the digital block 114, and the counter 116 may be collectively referred to as the digital blocks 110 through 116. The baseband processor 126, and other components shown in FIG. 1, can also be referred to as digital blocks.

The sample specific timestamp generated by digital block 116 indicates the relative time difference between contiguous samples, in the sample time domain of the receiver digital system 100. For example, the sample rate for the ADC output sample 106, the processed sample 113, and the processed sample 136, and by association the signal update rate of the indicator signals 145, 147, and 149, may be different. The sample rates of ADC output sample 106, the processed sample 113 and the processed sample 136, may also be proportional to each other having a fixed, deterministic relationship to each other as may be governed by the particular protocol governing the analog input 104. In other words, for a particular protocol governing the analog input 104, the sample rate for the ADC output sample 106 may be, for example, 3.84 MHz (which sets the indicator signal 145 update rate). The output sample rate for the processed samples 113 and 136 may be 120 kHz and 60 kHz respectively, appropriately scaling each of their respective sample indicator signals 147 and 149. If the indicator signal 145 is selected at the selection switch 150, the counter 116 updates the time stamp signal 152 generated in block 116 every 260 nSec (i.e., 1/3.84 MHz). If the indicator signal 147 or the indicator signal 149 is selected at the selection switch 150, the counter 116 updates the value of the time stamp signal 152 every 8.33 uSec or 16.67 uSec respectively (i.e., 1/120 kHz or 1/60 kHz, respectively). Accordingly, three different time stamp values may be generated by the counter 116 based on the signal selected at the selection switch 150. The timestamp information is communicated from sample counter 116 to the baseband processor 126 using the timestamp signal 152, whereby the baseband processor 126 may subsequently assign the value of the timestamp signal 152 to the processed sample 136. For example, if signal 149 is selected at the selection switch 150, the timestamp values may be 0, 1, 2, . . . N for N successive samples in the processed sample 136 at the baseband processor 126. If the indicator signal 147 is selected at the selection switch 150, time stamp values may be 0, 2, 4, . . . 2×N for N successive samples in the processed sample 136 at the baseband processor 126. If the indicator signal 145 is selected at the selection switch 150, time stamp values may be 0, 64, 128, . . . 64×N for N successive samples in the processed sample 136 as updated on the timestamp signal 152 to the baseband processor 126. The timestamp value, communicated over the timestamp signal 152 when processed sample 136 arrives, may be proportional to the rate scaling for each of the sample indicator signals 145, 147, 149. But the resolution of the intra-sample timestamp precision may be greater when incrementing the counter 116 with a signal with a faster sample rate.

Increased sample resolution may be advantageous in changing from a mode handling signals of one type of protocol, to a mode handling signals of another type of protocols. Specifically, incrementing the timestamp value at a faster rate provides greater resolution in time precision during the intermediate period between the processed sample 136 and a subsequent sample, and the period between the subsequent sample and a sample after that, and so on. An increased inter-sample counter precision may be advantageous when maintaining synchronization to different protocols during a mode change, whereby a transition from a current operational protocol to a different protocol is being accomplished. During a mode change, the baseband processor 126 may query the counter 116 at any time between sample periods of the processed sample 136 and subsequent samples received at the baseband processor 126, thereby reading a current counter value from the counter 116 so as to provide greater resolution in the precision of a receiver configuration change relative to the sample time domain. This increased precision may permit the receiver system 100 to preserve operational synchronization to two disparate protocols in tandem. For example, the sample update rate of the indicator signal 145 for a first and second protocol may be fixed at 3.84 MHz, but the sample rates for the indicator signals 147 and 149 may be different for the first protocol compared to the second protocol. Specifically, for the first protocol sample rates for the indicator signals 147 and 149 may be 120 kHz and 60 kHz respectively. But for the second protocol, sample indicator signals 147 and 149 may be updated at 160 kHz and 20 kHz respectively. Utilizing the faster sample rate indicator signal 145, that is common to both protocols, provides a common sample time domain in which to initiate mode changes between protocols so as to preserve the synchronization to a first protocol while operating in a second protocol. In other words, a'priori knowledge of the sync symbol rate for a first protocol, as determined within a first sample time domain, may be mapped into the sample time domain used to track the sync symbol rate of a second protocol, if the sample time domain for both protocols is the same. This common sample time domain for different protocols provides a time basis by which the controller of the receiver digital system 100 may track sync symbol rates, slot times, and frame structure periods, of disparate protocols in tandem, independent of the final sample rate at the processed sample 136. Accordingly the receiver digital system 100 may process the sampled received data of incoming signals from an active first protocol, using a common sample time domain to a second inactive protocol, the common sample time domain providing an accurate means of tracking the inactive second protocol using background processing relative to the active protocol.

The ADC 102, the digital block 112, the digital block 114, and the counter 116 are respectively driven by a clock input 118, a clock input 120, a clock input 122, and a clock input 124. The digital blocks 112 and 114 are coupled in a cascading configuration, meaning that the digital block 114 receives as an input the processed sample 113 from the digital block 112. A cascading configuration can be used to achieve a higher filter order, sample rate scaling, and other digital signal processing. The clock inputs 118, 120, 122 and 124 sets the processing speed of their respective digital components. The clock inputs 118, 120, 122 and 124 do not have to be the same clock frequency; however, the frequency may be sufficiently high to ensure that the sample processing for their respective digital components is finished in a timely fashion so as to avoid sample overflow. Sample overflow is the condition where samples in signals 106, 113 or 136 may be "dropped", or not processed by a subsequent digital component, because the digital block receiving a new sample is actively processing a current sample (at a slower rate), during which time the new sample is ignored, and eventually replaced with a subsequent sample before being processed by the digital component. Clock inputs 118, 120, 122 and 124 may be integer related to each other, and may also be integer related to the sample rate for the ADC output sample 106, the processed sample 113 and the processed sample 136. For example, the clock input 122 may be set to 2.88 MHz to process the processed sample 113 and produce a processed sample 136 of 60 KHz, while clock inputs 120 and 118 may be set to 7.68 MHz so as to produce an output sample rate of 3.84 MHz and 120 kHz in signals 106 and 113 respectively. In each instance, clock inputs 118, 120, 122 and 124 are integer multiples of their input signal's data rate, the integer multiple being set to ensure completion of the digital processing of a current sample before arrival and a new sample.

The baseband processor 126 may be a controller, a baseband processor, Field Programmable Gate Array (FPGA) or a combination thereof. The baseband processor 126 may set the configuration of ADC 102, the clock inputs 118 through 124, the digital block 112, the digital block 114, and the counter 116. The clock inputs 118 through 124 can be generated in part by a clock generation unit internal or external to the receiver digital system 100 (not shown). The baseband processor 126 can independently control the activation of clock inputs 118 through 124 to their respective digital block 110 through 116; therefore, none, one, or more clock signal 118 through 124 may be active as controlled by baseband processor 126.

Through use of a control state machine 140, the receiver digital system 100 can control the ADC 102, the digital block 112, the digital block 114, and the counter 116 so as to process incoming signals of some protocols and also switch to different modes to process incoming signals of different protocols. The control state machine 140 can send a control signal 128, a control signal 130, a control signal 132, and a control signal 134 to cause certain behavior in the ADC 102, the digital block 112, the digital block 114, and the counter 116, respectively. By causing such behavior, the receiver digital system 100 processes signals and also allows for real-time switching of modes to process signals of other protocols. Specifically, each control signal 128, 130, 132 and 134 can in real-time trigger or control behavior of the digital blocks 110, 112, 114 and 116. The control signals 128 through 134 may facilitate mode changes in the receiver digital system 100 when transitioning between different protocols.

Controlling behavior of the digital blocks 110, 112, 114 and 116 includes, for example, independently or in tandem enabling, disabling, holding in constant reset, any of the digital blocks 110 through 116 or a combination thereof, and so on. An example of controlling behavior includes reconfiguring one or more of the digital blocks 110 through 116 in response to the respective control signals 128 through 134. For example, different filter coefficients may be loaded into one or more of the digital blocks 110 through 116 as may be dictated by different protocol requirements.

As a further example of controlling behavior, the control signals 128 through 134 may also serve to blank one or more of the ADC 102, the digital block 112, the digital block 114, and the counter 116. For the purposes of this discussion, blanking output samples is defined as fixing the value of a targeted group of output samples spanning a set period of time to a value as may be suitable for processing by subsequent digital components. The blanking value may vary depending on the specific protocol requirements, with values ranging from a value zero to nominal twos-complement binary values that are suitable for transient mitigation.

The control signals 128 through 134 may control the behavior of the digital blocks 110 through 116 in a sequenced order, such that undesired transient generation is mitigated at startup.

The control state machine 140 may be any suitable digital device such as a processor, controller, or FPGA. The control state machine may also be part of the baseband processor 126. In the exemplary embodiment shown in FIG. 1, the baseband processor 126 configures the control state machine 140 through a state machine signal 160.

As explained below, the baseband processor 126, by strategically controlling the clock signals 120 through 124, in conjunction with the control state machine 140, enables the receiver digital system 100 to process incoming signals according to multiple protocols. The baseband processor 126 can operate in multiple modes, each mode for allowing the device to process signals according to certain protocols. Additionally, each mode has one or more states that allow the receiver digital system 100 to process signals at certain stages. For example, each mode may have one or more of: (1) a standby state, wherein receiver digital system 100 operates in a certain manner while waiting to receive a desired on channel received signal at the analog input 104; (2) an initial operating state, wherein the receiver digital system 100 operates in a certain manner to begin processing desired on channel received signal; and (3) an active state, wherein receiver digital system 100 generates valid sampled received output samples at the processed sample 136 under nominal, steady state operating conditions and where samples are subsequently processed by the baseband processor 126. Each standby state, initial state, and active state for any given mode may have various characteristics and are selected such that the receiver digital system 100 can process signals of one or more types in one mode and signals of one or more different types in another mode.

In one exemplary standby state for some communication protocols, the baseband processor 126 may continuously process, holding at least part of the receiver digital system 100 in continuous run. The ADC digital modulator 110 of the ADC 102 may be configured to continuously generate output samples, regardless of whether there is a desired on-channel signal at the analog input 104. This configuration may be desirable during a TDMA slot time during which the receiver digital system 100 is not assigned to receive a desired on-channel signal. During those slot times that are not assigned to the receiver digital system 100, the baseband processor 126 may configure the receiver digital system 100 to operate in a standby mode. Accordingly, in one exemplary standby mode for certain protocols, the baseband processor 126 may configure the clock generation unit (not shown) to continuously generate clock input 118 (also referable to as an ADC clock input) so as to drive the ADC digital modulator 110. The baseband processor 126 may activate one or more of the digital blocks 112 through 116 by configuring a clock generation unit to generate one or more clock inputs 120 through 124 so as to drive the respective digital blocks 112 through 116. While, being driven in standby, one or more of the digital block 112 and block 114 may be operating, although not necessarily processing or producing valid sampled received data. The baseband processor 126 may activate counter 116 and configure the selection switch 150 to select the indicator signal 145 so as to generate a timestamp based on the ADC output sample rate (also known as the time domain of the ADC output sample 106). The receiver digital system 100 then generates the processed sample 136 having a timestamp generated in the time domain of the ADC output sample 106. The baseband processor 126 may resume processing the processed sample 136 based on either a'priori knowledge of the protocol governing the arrival of assigned slot times containing a desired on-channel signal or based on a "on demand" receive acquire signal. The receive acquire trigger that may be asserted by a secondary processor (not shown), for example. During operation in this standby state, the baseband processor 126 may receive a receive acquire signal 138, indicating to the baseband processor 126 to resume processing of the processed sample 136. The receive acquire signal 138 may be any signal that instructs the baseband processor 126 to begin or resume signal processing, thereby transitioning from a standby state to an initial operating state.

In an exemplary initial operating state, the baseband processor 126 may activate all the clock signals at 118, 120, 122, and 124, thereby providing a clock signal to the associated digital blocks 110 through 116. After the clock signals are active, the baseband processor 126 may then trigger the control state machine 140, through the state machine signal 160, to initiate a start-up sequence. The startup sequence within the initial operating state may activate various digital blocks in a specific order. The order may vary depending on the operating protocol. The start-up sequence may include, for example, activating the digital blocks 110 and 116 in tandem, followed by starting the digital blocks 112 and 114 in tandem (wherein timestamps are referenced to time domain of the ADC output sample 106); starting the digital blocks 110 and 112 in tandem, followed by activating blocks 114 and 116 in tandem (wherein timestamps are referenced to the time domain of the processed sample 136); or starting the digital blocks 110 and 114 in tandem, followed by activating the digital blocks 112 and 116 in tandem (wherein timestamps are referenced to the time domain of the processed sample 113). In addition, the baseband processor 126 may begin processing the processed sample 136, although signals at the analog input 104 may not necessarily be valid, on-channel signals.

In different protocols, the signal at the analog input 104 must begin processing in a manner that sets a constant time of arrival (TOA) from the start of processing at the ADC digital modulator 110 to the arrival of the signals in the processed sample 136. Accordingly, in a standby state in an exemplary mode, the baseband processor 126 may configure clock generation unit (not shown) to enable all clock signals 118 through 124 while holding the ADC digital modulator 110, the digital block 112, the digital block 114, and the counter 116 in constant reset through the control inputs 128, 130, 132 and 134. A reset state for a digital block is defined as a state wherein internal processing gates are "forced" to a known logic level (either logic high or logic low) and held there until the reset signal is released, regardless of the application of a clock signal into the digital block itself. The control signals 128, 130, 132, and 134 are managed by the control state machine 140. Therefore, the baseband processor 126 controls the reset condition of digital blocks 110, 112, 114, and 116 by signaling the control state machine 140 via the state machine signal 160 which blocks are to be put into reset, when reset is to be asserted, or when reset is to be released so as to allow the digital components to begin processing of input sampled received data. The baseband processor 126 also may disable the clock inputs 120 through 124 as part of the reset state. In some embodiments, the baseband processor 126 may directly control configuration signals 118, 120, 122 and 124 (i.e.: bypassing the control state machine 140). During operation in this standby state, the baseband processor 126 may receive the receive acquire signal 138 to begin processing the analog input 104. The receive acquire signal signifies the transition from this continuous reset standby state, to another initial operating state.

In the post-reset initial operating state in this mode, the baseband processor 126 triggers the control state machine 140 to release the plurality of digital blocks 110 through 116 from constant reset in tandem, using the control inputs 128 through 134. Typically, the clock inputs 118 through 124, as well as setting of the selection switch 150 to select the proper sample signal, are done prior to removing the digital blocks 110 through 116 from reset. Once released from reset simultaneously, the plurality of digital blocks 112 through 116 begin processing their respective input samples in tandem. Given that there is a fixed, finite processing delay between the start of processing of an input signal, to the generation of an appropriate output sample for each digital block, then releasing reset in tandem for all digital blocks will ensure a fixed delay from the reset release time to the time of arrival (TOA) of the first valid sample at processed sample 136. The TOA from the start of ADC 102 sample generation to the arrival of a valid output sampled at the processed sample 136 will correspond to the cumulative processing delay for each block 110, 112, and 114. The processing delay for an individual digital block may vary depending on its specific function and complexity, however, their respective processing delays are fixed for a given configuration assuming a digital block is released from a reset standby state. Accordingly, the cumulative processing delay, which dictates the TOA from the start of processing at digital block 110 to the arrival of the processed sample 136, will be fixed when transitioning for a Reset standby state to an initial operating state where all digital blocks are released from reset in tandem.

One advantage of exemplary devices disclosed herein is that the receiver digital system 100 can be configured to transition from one mode to another in real-time, thereby enabling the ability to process signals of different protocols without loss of synchronicity to different protocols. This is accomplished in that each operating protocol is affiliated with a particular mode governing the receiver digital system 100 during operation, and each mode is comprised of a standby states, an initial operating state, and an active state. A particular configuration state of may be shared by multiple modes. For example, the same standby state configuration may be included in several modes, each mode being affiliated with a different protocol. In addition, a common initial operating state configuration may be shared by different modes; however, for most applications, the final active state of a mode may be particular to a targeted operating protocol (i.e.: an active state during which the receiver digital system 100 is processing an assigned slot time to generate valid samples is generally protocol specific, although the particular sample rate at which receiver digital system 100 operates may be common for multiple protocols). Accordingly, when transitioning from first protocol to a second protocol, the receiver digital system 100 may switch from operating in a standby state configuration of one mode for processing signals at the analog input 104 of a first protocol, to an initial operating state affiliated with a second protocol. When transitioning from a shared state to a different state within a different mode (for a different protocol) the baseband processor 126 must manage the clock inputs 120 through 124, and the control signals 128 through 134 to ensure proper behavior for the particular mode of operation.

After the baseband processor 126 has switched to an exemplary initial operating state, it subsequently transitions to an active state associated with the final targeted protocol so as to process signals during active receive. After the on channel desire signal is properly processed during active receive, the baseband processor 126 may revert the receiver digital system 100 back to a standby state that is shared by multiple protocols in preparation for possible transition to operate in a different protocol.

Sometimes the receiver digital system 100 may need to transition from a first standby state for processing signals according to some protocols to a different standby state that can handle signals of other protocols, where the standby states are fundamentally different and exclusive to each other. For example, transitioning the receiver digital system 100 from a state of continuous reset to a standby state of continuous processing, could introduce transient responses upon start-up, introduce random TOA periods between the start of sample processing of the ADC digital modulator 110 and the arrival of the first valid sample at the processed sample 136, or may otherwise negatively affect the resulting processed sample 136. Alternatively, transitioning the receiver digital system 100 from a standby state of continuous processing directly to an initial operating state of constant reset could cause the loss of synchronization to previous protocol timing as preserved in the continuous generation of the sample timestamp or otherwise negatively affect the resulting processed sample 136.

To avoid the potential disadvantages of switching between a state for handling one protocol to a state for handling another protocol, the receiver digital system 100 may operate in a dynamic initial operating state wherein the baseband processor 126 can selectively control digital components to transition between processing signals of different protocols.

In an exemplary initial operating state, of an exemplary mode, that may be referred to as a dynamic initial operating state, the baseband processor 126 is operable to configure the control state machine 140 to selectively sequence digital blocks 110 through 116, or a combination thereof, to selectively activate the digital blocks 112 through 116. Upon receiving the receive acquire signal 138, the baseband processor 126 can switch from operating in any standby state to a different standby state while presenting the critical timing characteristics of the first standby state. The baseband processor 126 may then transition into any given initial operating state while preserving timing information from a different protocol. The baseband processor 126 activates the clock inputs 120 through 124, the control inputs 130 through 134, or a combination thereof, to enable processing at some or all of the digital blocks 112 through 116 at certain times as described previously. However, if the receiver digital system 100 must transition from a first mode to a second mode having an initial operating state that requires an second standby state that is not currently operating, the baseband processor 126 may revert to the second standby state first, before transitioning to the initial operating state, whereby said transition is optimally accomplished. For example, if the receiver digital system 100 is currently operating in a continuously operating standby state, wherein a timestamp is continuously being generated, but the receiver digital system 100 must first transition to a second standby state that is in constant reset prior to activating the new initial operating state, the baseband processor 126 may first configure switch 150 to select the clock source signal 172 as its sample counter clock source, where the clock source signal 172 is derived from an independent clock source 170 that is frequency coherent to the indicator signal 145. Once the clock source signal 172 is selected, thereby preserving the sample timestamp precision relative to the first mode, processor 126 may then set digital blocks 110, 112, and 114 to constant reset standby state, thereby disabling the indicator signals 145, 147 and 149. The receiver digital system 100 is then appropriately configured to transition into an initial operating state with a fixed TOA at the processed sample 136 as previously described; however, the timestamp information from the previous mode (i.e.: protocol specific first mode) is preserved since the counter 116 is continuously updating the timestamp so as to preserve synchronization timing. Once the receiver digital system 100 has transitioned from the new initial operating state into the appropriate active state, the receiver digital system 100 must process all signals at the analog input 104 for the duration of the active state. Once the baseband processor 126 has processed all desired signals during the active state, the baseband processor 126 may then return the receiver digital system 100 to the second standby state of constant reset, or revert the receiver digital system 100 back to the first standby state where the ADC digital modulator 110 and the counter 116 are continuously running (i.e.: operating continuously) and the indicator signal 145 is selected at the selection switch 150. Additionally, if the baseband processor 126 transitions back to a standby state wherein the selection switch 150 selects the indicator signal 145, the transition may need to occur phase coherent to the clock source signal 172 so as to eliminate the introduction a timing ambiguity cause by the constant reset state at the ADC digital modulator 110. In other words, the transition to constant reset for the ADC digital modulator 110 occurred randomly relative to the initial standby state sample time domain. Therefore, when restarting the initial continuously running standby state, the ADC digital modulator 110 must be activated in a manner that is phase aligned with the clock source signal 172 prior to configuring the selection switch 150 to revert from the clock source signal 172 to the indicator signal 145.

In addition, depending on the protocol that governs the processing of signals at the analog input 104, the baseband processor 126 may strategically hold the processing of some digital blocks in reset, or blank the output sample value of one or more digital blocks to a known, predetermined value. This combination of reset and blanking samples is optimized to minimize transient responses of a particular digital block and the receiver digital system 100 in general. In switching to some protocols, for example, it may be optimal to continuously operate the ADC digital modulator 110 so as to produce the ADC output sample 106, while simultaneously blanking the output sample signal 113 of the digital block 112, thereby allowing the receiver digital system 100 to adjust to processing the new protocol. By simultaneously running some digital blocks, and blanking others, depending on the mode governing the processing of protocol-specific incoming signals at the analog input 104, the receiver digital system 100 has greater control in mitigating transient responses that are generated when enabling the initial standby state or transitioning from a standby state to an initial operating state. This transient mitigation, in turn, minimizes sample corruption. This is all accomplished while the ADC digital modulator 110 may be configured to continuously process samples synchronous to timestamp generation at the counter 116.

Additionally, when switching from a standby state where the baseband processor 126 holds the digital blocks 112 and 114 in constant reset as described herein, the baseband processor 126, in the dynamic initial operating state, can further be configured to simultaneously release the digital blocks 110, 112 and 114 from constant reset. The baseband processor 126 may continue to monitor the timestamp generation from the counter 116 which continues to track a different mode (protocol specific) timing, as described above. This is accomplished while providing the required standby state, such that, when transitioned to an initial operating state, when the digital blocks 110, 112, and 114 are released in tandem from reset through the control inputs 128 through 132, the first valid sample in the processed sample 136 arrives at a fixed TOA.

For purposes of this disclosure, a plurality of components is coupled to an additional component when one or more of the plurality of components is coupled to the additional component. Clock inputs used as part of devices disclosed herein can be independent and have the same, or different frequencies. Clock inputs can also operate at different frequencies. The receiver digital system 100 may incorporate additional digital blocks or less, as needed. All clock inputs can be generated from independent, internal clocks or produced by external clocks. Additionally, the clock inputs can be passed from any one component of the receiver digital system 100 to the next.

Figure 2:
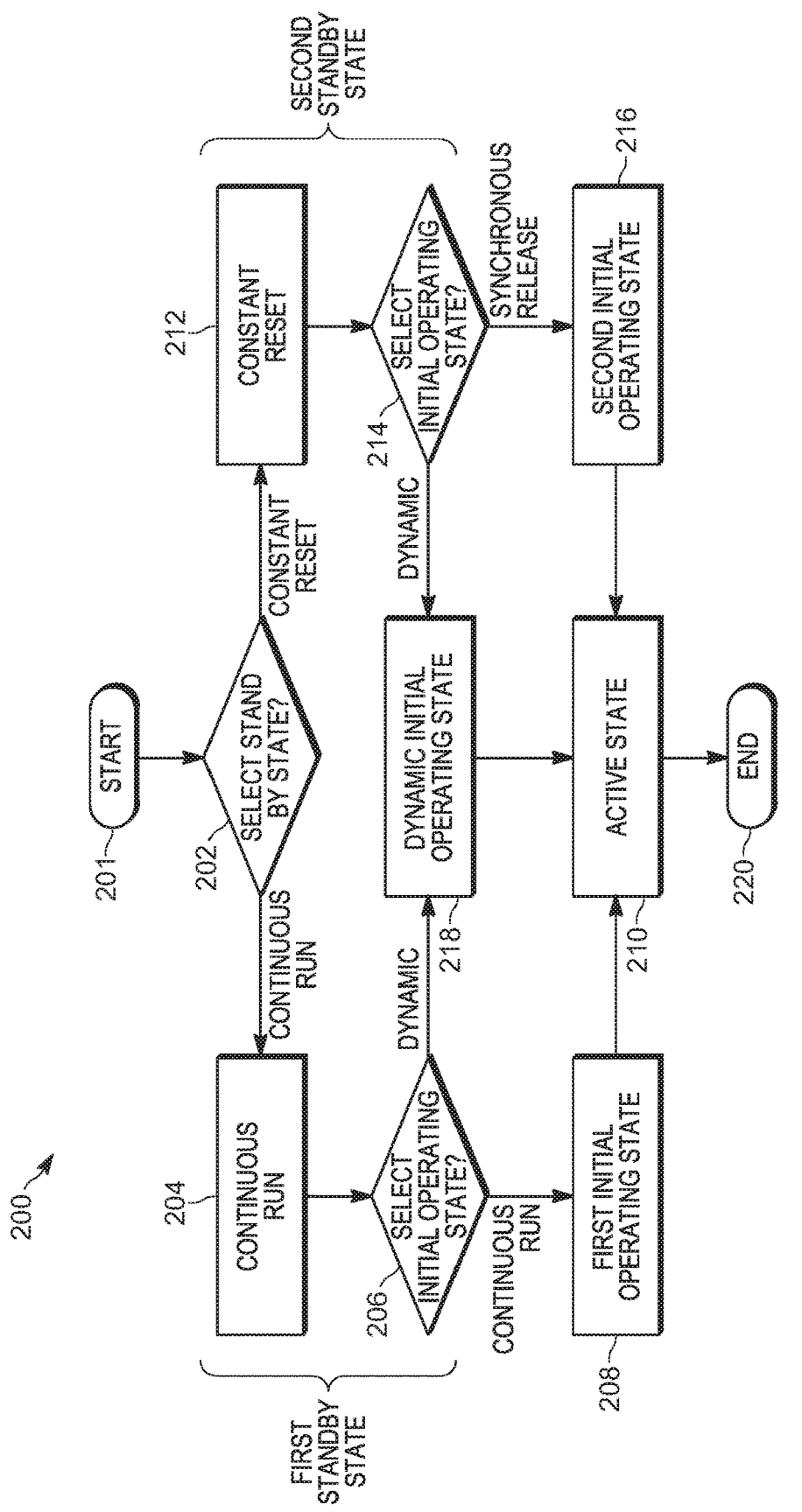
FIG. 2 is a flow chart of a signal processing method in accordance with some embodiments.

FIG. 2 depicts an exemplary signal processing method for multi-mode sample generation in accordance with some embodiments. The method allows for handling a plurality of input signals of different protocols and switching modes in real time to process the plurality of input signals. The method may be used in accordance with the exemplary device of FIG. 1, described above.

The method 200 starts at step 201. In some protocols, a plurality of input signals may be continuously sampled by an ADC, digital blocks, or a combination thereof. In other protocols, an ADC, digital blocks, or a combination thereof may be held in a state of constant reset and must be activated by a baseband processor or a control signal state machine at a time relative to other components (such as the ADC, and one or more digital blocks). Accordingly, at step 202, the method includes selecting a standby state, each standby state being part of a mode that is associated with one or more protocols. Each mode is comprised of three states which may be iterated in sequential order, including a standby state, an initial operating state, and finally an active processing state. At step 202 in method 200, the standby state is selected by either default or for a selected protocol governing the active on-channel desired received signal. If a continuous run (i.e., constant processing of sampled received data) standby state is selected, the method proceeds to step 204. At step 204, the method includes operating in a first standby state of a first mode, which includes enabling the ADC digital modulator, one or more digital blocks coupled to the ADC digital modulator, or a combination thereof, to process a plurality of input signals without regard to the presence of desired on channel signal being present (i.e., the digital components may operate on noise or invalid samples from a preceding stage). The first standby state includes steps 204 and 206.

At step 204, the method includes waiting to receive a trigger signal, such as a receive acquire signal. The receive acquire signal is a suitable signal to cause the method 200 to begin producing valid sampled received signals, moving from a standby state to an initial operating state depending on the mode selection governing the sample processing. Once a receive acquire signal is received in the first standby state, the method proceeds to step 206. At step 206, the method includes determining which initial operating state, and therefore which corresponding mode, will be used to process a desired on-channel received input signal. If the protocol regulating the received input signal can be processed by continuously running the ADC and one the plurality of digital blocks, the method includes proceeding to step 208. Step 208 is the first initial operating state in a first mode. At step 208, the method includes activating clock signals and control signals to digital components not previously enabled to continuously process sampled data in a manner aligned with a first operating mode. The method 200 includes proceeding from step 208 after a predetermined interval to an active state at step 210, wherein processing the continues for the duration of the reception of a desired on-channel received input signal.

If, at step 202, a second standby state is selected, the method 200 proceeds to step 212. At step 212, the method includes continuously resetting components that are affiliated with direct processing of the on channel sampled received data signal produced by the ADC. This step may also include disabling the plurality of associated clock inputs to those digital blocks in constant reset.

At step 212, the method includes waiting to receive a trigger signal, such as a receive acquire signal. The trigger signal is a suitable signal to cause the processor, or any controlling state machine, to enable all appropriate digital blocks for generating sampled received data, while simultaneously transitioning from a standby state to an initial operating state. Once a trigger signal is received in the second standby state, the method proceeds to step 214. At step 214, the method includes determining which initial operating state, and therefore which corresponding mode, will be used to process a desired on-channel signal. If the protocol of the on-channel signal requires a deterministic, fixed time of arrival (TOA) from a receive acquire signal to the arrival of the first valid sample at the processed sample 136, the method 200 proceeds to step 216. Step 216 is a second initial operating state in a second mode. At step 216, method 200 includes simultaneously releasing the plurality of digital blocks from constant reset, activating each of the plurality of clock inputs and control signals, and enabling the data transport mechanism whereby the final output sampled data may be received.

After the output samples are generated for a predetermined time, the method includes transitioning to an active state at step 210, wherein processing at the baseband processor may continue for the duration of receiving a desired on channel signal. It should be noted that the active state in a second mode (i.e.: step 210 preceded by step 216) does not necessarily mean that the digital blocks are configured the same as the active state in a first mode (i.e.: step 210 preceded by step 208). The mode specific active state may be unique, and method 200 does not dictate that all modes must operate in a common active state where all digital components are configured the same. In addition, the standby state in a first mode may dictate a different configuration of the digital blocks from that of the standby state corresponding to a second mode. Also, the initial operating state of a first mode may dictate a different digital block configuration from the initial operating state of a second mode. In all instances, a mode is associated with a particular protocol that governs the desired, on channel received signal at analog input 104.

When a trigger signal is received at step 204 or step 212, it may be desirable to operate in a dynamic initial operating state as part of a third mode. The dynamic initial operating state is desirable when first operating in a standby state waiting to receive signals of one type of protocols, but then it is necessary to transfer to an initial operating state capable of processing signals of another protocol. Accordingly, the method includes operating in a dynamic initial operating state at step 218. Upon receiving a trigger signal at step 204 and upon selecting the dynamic initial operating state at step 206, the method includes transitioning from operating in the continuous run standby state to the dynamic initial operating state at step 218. Upon receiving a trigger signal at step 212, and upon selecting the dynamic initial operating state at step 214, the method includes transitioning from operating in the constant reset standby state to the Dynamic initial operating state at step 218.

Step 218 includes selectively applying the clock signals, selectively activating some or all of the digital blocks in particular sequences, and if required, managing the timestamp counter block and sample count source so as to track the elapsed time from a past synchronization from a previous mode (i.e.: protocol). Depending on the protocol governing the input signal that is to be processed, the baseband processor may strategically assert reset for some or all of the digital components (i.e.: emulating a different starting standby state), or force an output of one or more digital blocks to a known or neutral value, (i.e.: to minimize undesired transient response), or reconfigure the timestamp generation configuration by selecting a clock for generating the timestamp from an source external to actual sample generation. By simultaneously running some digital blocks and blanking others depending on the operational protocol of incoming signals, undesired transient responses may be minimized so as to optimize the fidelity of the digital processing of the sampled received signal generation. In addition, by selecting a clock source coherent with an original sample rate signal used in generating a previous mode's timestamp, the processor can change some or all of the digital block configurations and processing states (i.e., transition from continuous run to constant reset), without risk of losing synchronization to a different protocol's timing constraints. After a predefined period of time, method 200 may transition from the dynamic initial operating state step 218 to active state at step 210 wherein the baseband processor processes the processed sample 136 for the duration of receiving a desired on-channel signal. The method ends at step 220.

When transitioning from the continuous reset state at step 212 to step 214 to step 218, the method 200 may include at step 218 simultaneously releasing each of the plurality of digital blocks from continuous reset and activating each of the plurality of clock inputs.

Additional steps may be added to the exemplary methods described or existing steps may be removed or rearranged. "First" and "second" and so forth are used to distinguish between states for discussion purposes, not to define a type of state that is a first state and a second state and so forth. Additionally some methods can repeat steps in the method. For example, instead of ending at step 220 after step 210, a method could proceed back to step 202, or any other suitable step.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims, including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having,"

"includes," "including," "contains," "containing," or any other variation thereof, are intended to cover a non-exclusive inclusion, such that a process, method, article, or device that comprises, has, includes, contains a list of elements does not include only those elements but may include other elements not expressly listed or inherent to such process, method, article, or device. An element proceeded by "comprises . . . a," "has . . . a," "includes . . . a", "contains . . . a" does not, without more constraints, preclude the existence of additional identical elements in the process, method, article, or device that comprises, has, includes, contains the element. The terms "a" and "an" are defined as one or more unless explicitly stated otherwise herein. The terms "substantially," "essentially," "approximately," "about," or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or device described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A receiver digital system for generating an output sample, the receiver digital system comprising:
    an analog-to-digital converter (ADC) for sampling a plurality of input analog signals and producing an ADC output sample, the ADC comprising:
        an ADC front end comprising non-timing-critical components; and
        an ADC digital modulator comprising timing-critical components;
    a plurality of digital blocks coupled to the ADC digital modulator, the plurality of digital blocks comprising a counter for assigning a timestamp to the ADC output sample; and
    a baseband processor for controlling a plurality of clock inputs according to a plurality of different protocols, the plurality of clock inputs driving the ADC digital modulator and the plurality of digital blocks, wherein the baseband processor is configured to:
        operate in a plurality of modes comprising a first mode and a second mode, the first mode comprising a first mode standby state and a first mode initial operating state, the second mode comprising a second mode initial operating state and a second mode standby state;
        transition from the first mode standby state to the first mode initial operating state;
        transition from the second mode standby state to a second mode initial operating state;
        transition from the first mode standby state to a dynamic initial operating state; and
        transition from the second mode standby state to the dynamic initial operating state.

2. The receiver digital system of claim 1, wherein, when operating in the first standby state, the baseband processor is configured to:
    continuously generate a plurality of ADC output samples with the output sample rate functioning as an indicator signal for generating a timestamp in a time domain of the ADC digital modulator; and
    continuously run a second clock input of the plurality of clock inputs to drive at least a first digital block of the plurality of digital blocks.

3. The receiver digital system of claim 1, wherein, when operating in the first standby state, the baseband processor is configured to hold in constant reset the ADC digital modulator and the plurality of digital blocks.

4. The receiver digital system of claim 1, wherein the baseband processor, when operating in the dynamic initial operating state, is operable to selectively apply the plurality of clock inputs and selectively activate the plurality of digital blocks.

5. The receiver digital system of claim 4, wherein the baseband processor, when operating in the dynamic initial operating state, is operable to:
    blank at least a first digital block output sample of a first digital block of the plurality of digital blocks, while simultaneously permitting at least a second digital block of the plurality of digital blocks to generate a second digital block output sample for a portion of time so as to create a plurality of transient responses;
operate in the third initial operating state for a predefined period of time; and
after the predefined period of time, transition to an active state.

6. The receiver digital system of claim 4, wherein, when operating in the dynamic initial operating state, the baseband processor is further configured to simultaneously release at least a first digital block of the plurality of digital blocks and a second digital block of the plurality of digital blocks from continuous reset.

7. The receiver digital system of claim 1, wherein the plurality of digital blocks are coupled in a cascading configuration, wherein at least a first digital block of the plurality of digital blocks is driven by a first clock input of the plurality of clock inputs, the first clock input having a frequency that is an integer factor of an ADC output sample frequency.

8. The receiver digital system of claim 1, wherein:
the plurality of digital blocks comprise a cascaded integrator-comb filter coupled to an infinite impulse response filter, the infinite impulse response filter coupled to a finite impulse response filter; and
the ADC comprises a sigma delta modulator.

9. The receiver digital system of claim 1, further comprising a switch operable to select at least a first indicator signal of a plurality of indicator signals to pass to the counter, thereby determining a rate at which the value of the timestamp is generated, wherein:
the plurality of indicator signals comprises a first indicator signal generated by the ADC digital modulator and a second indicator signal generated by a first digital block of the plurality of digital blocks;
the first indicator signal is synchronized in time with the ADC output sample; and
the second indicator signal is synchronized in time with a processed sample generated by the first digital block.

10. A signal processing method comprising:
sampling a plurality of input analog signals with an analog-to-digital converter (ADC) to produce an ADC output sample, wherein a plurality of digital blocks is coupled to an ADC digital modulator, the ADC digital modulator comprising timing-critical components; and
controlling a plurality of clock inputs, the ADC digital modulator, and the plurality of digital blocks according to a plurality of protocols, thereby generating an output sample, wherein the controlling the plurality of clock inputs, the ADC digital modulator, and the plurality of digital blocks comprises operating in a plurality of states, the plurality of states comprising a first mode standby state, a second mode standby state, a first mode initial operating state, a second mode initial operating state, and a dynamic initial operating state, wherein operating in the plurality of states comprises:
transitioning from operating in the first mode standby state to operating in the first mode initial operating state;
transitioning from operating in the second mode standby state to operating in the second mode initial operating state;
transitioning from operating in the first mode standby state to operating in the dynamic initial operating state; and
transitioning from operating in the second mode standby state to operating in the dynamic initial operating state.

11. The method of claim 10, wherein operating in the first standby state, comprises:
continuously generating a plurality of ADC output samples with the output sample rate functioning as an indicator signal for generating a timestamp in a time domain of the ADC digital modulator; and
continuously running a second clock input of the plurality of clock inputs to drive at least a first digital block of the plurality of digital blocks.

12. The method of claim 10, wherein operating in the first standby state comprises holding in constant reset the ADC digital modulator and the plurality of digital blocks.

13. The method of claim 10, wherein operating in the dynamic initial operating state comprises selectively applying the plurality of clock inputs and selectively activating the plurality of digital blocks.

14. The method of claim 13, wherein:
the method comprises operating in the dynamic initial operating state for a predefined period of time, and after the predefined period of time, transitioning to an active state; and
operating in the dynamic initial operating state comprises blanking at least a first digital block output sample of a first digital block of the plurality of digital blocks, while simultaneously permitting at least a second digital block of the plurality of digital blocks to generate a second digital block output sample for a portion of time so as to create a plurality of transient responses.

15. The method of claim 13, wherein operating in the dynamic initial operating state comprises simultaneously releasing at least a first digital block of the plurality of digital blocks and a second digital block of the plurality of digital blocks from continuous reset.

16. The method of claim 10, wherein the plurality of digital blocks are coupled in a cascading configuration, wherein at least a first digital block of the plurality of digital blocks is driven by a first clock input of the plurality of clock inputs, the first clock input having a frequency that is an integer factor of an ADC output sample frequency.

17. The method of claim 10, wherein:
the plurality of digital blocks comprise a cascaded integrator-comb filter coupled to an infinite impulse response filter, the infinite impulse response filter coupled to a finite impulse response filter; and
the ADC comprises a sigma delta modulator.

18. The method of claim 10, further comprising selecting at least a first indicator signal of a plurality of indicator signals to pass to the counter, thereby determining a rate at which the value of the timestamp is generated, wherein:
the plurality of indicator signals comprises a first indicator signal generated by the ADC digital modulator and a second indicator signal generated by a first digital block of the plurality of digital blocks;
the first indicator signal is synchronized in time with the ADC output sample; and
the second indicator signal is synchronized in time with a processed sample generated by the first digital block.

* * * * *